US011482924B2

(12) United States Patent
Qin et al.

(10) Patent No.: US 11,482,924 B2
(45) Date of Patent: Oct. 25, 2022

(54) POWER ISOLATOR EXHIBITING LOW ELECTROMAGNETIC INTERFERENCE

(71) Applicant: Analog Devices International Unlimited Company, Limerick (IE)

(72) Inventors: Wenhui Qin, Shanghai (CN); Xin Yang, Beijing (CN); Shaoyu Ma, Shanghai (CN); Fang Liu, Beijing (CN); Yuanyuan Zhao, Reading, MA (US)

(73) Assignee: Analog Devices International Unlimited Company, Limerick (IE)

( * ) Notice: Subject to any disclaimer, the term of this patent is extended or adjusted under 35 U.S.C. 154(b) by 53 days.

(21) Appl. No.: 16/046,732

(22) Filed: Jul. 26, 2018

(65) Prior Publication Data

US 2020/0036284 A1     Jan. 30, 2020

(51) Int. Cl.
*H02M 1/44*     (2007.01)
*H02M 7/06*     (2006.01)
(Continued)

(52) U.S. Cl.
CPC .............. *H02M 1/44* (2013.01); *H01F 27/34* (2013.01); *H01F 38/14* (2013.01); *H02M 3/285* (2013.01);
(Continued)

(58) Field of Classification Search
CPC .......... H02M 1/44; H02M 7/06; H02M 3/285; H02M 1/0064; H02M 3/3382; H01F 27/34; H01F 38/14; H01F 27/2804; H01F 27/40; H03B 5/1212; H03B 5/1228; H03B 5/1296; H03L 7/099
See application file for complete search history.

(56) References Cited

U.S. PATENT DOCUMENTS 3,431,435 A  *  3/1969  Bizet .................. H04L 25/24
                                                     327/365
3,805,414 A  *  4/1974  Marsh ................ G09B 23/188
                                                     434/379
(Continued)

OTHER PUBLICATIONS

Spina et al., Current-Reuse Transformer-Coupled Oscillators With Output Power Combining for Galvanically Isolated Power Transfer Systems. IEEE Transactions on Circuits and Systems—I: Regular Papers. Dec. 2015;62(12):2940-2948.

*Primary Examiner* — Yusef A Ahmed
(74) *Attorney, Agent, or Firm* — Wolf, Greenfield & Sacks, P.C.

(57) ABSTRACT

Power isolators for providing electrical isolation between an input port and an output port that exhibit low electromagnetic interference (EMI) are described. The low EMI may be achieved by, for example, canceling out a common mode current across a transformer in the power isolator that may be converted into EMI. The power isolator may include at least one oscillator circuit that is configured to apply a first signal to a first transformer and a second, different signal to a second transformer. The first and second signals may be configured such that the common mode current generated in each of the first and second transformers has an opposite direction. Thus, the common mode currents in the first and second transformers may at least partially cancel out. As a result, the EMI exhibited by the power isolator may be reduced.

20 Claims, 8 Drawing Sheets

(51) Int. Cl.

| | | |
|---|---|---|
| *H01F 27/34* | (2006.01) | |
| *H03L 7/099* | (2006.01) | |
| *H01F 38/14* | (2006.01) | |
| *H03B 5/12* | (2006.01) | |
| *H02M 3/28* | (2006.01) | |
| *H02M 1/00* | (2006.01) | |

(52) U.S. Cl.
 CPC ............ *H02M 7/06* (2013.01); *H03B 5/1212* (2013.01); *H03L 7/099* (2013.01); *H02M 1/0064* (2021.05)

(56) References Cited

U.S. PATENT DOCUMENTS

| | | | | |
|---|---|---|---|---|
| 4,565,931 A * | 1/1986 | Fumey | ................ | H03K 17/691 336/200 |
| 5,416,364 A * | 5/1995 | Divjak | ................ | H02M 3/338 327/104 |
| 5,420,558 A * | 5/1995 | Ito | ...................... | H01F 17/0006 336/200 |
| 5,686,854 A * | 11/1997 | Smith | ................ | H03K 17/691 327/403 |
| 5,825,529 A | 10/1998 | Harpham | | |
| 6,639,481 B1 * | 10/2003 | Ravi | ...................... | H03B 27/00 331/177 V |
| 6,873,065 B2 | 3/2005 | Haigh et al. | | |
| 7,075,329 B2 | 7/2006 | Chen et al. | | |
| 7,586,347 B1 * | 9/2009 | Ren | ...................... | H03L 7/0898 327/148 |
| 7,706,154 B2 * | 4/2010 | Chen | ................... | H02M 3/338 363/17 |
| 8,084,894 B2 * | 12/2011 | Chen | ................ | H03K 17/6874 307/140 |
| 8,089,311 B2 * | 1/2012 | Chen | ................... | H03B 5/1296 327/560 |
| 8,213,197 B1 * | 7/2012 | Tan | ........................ | H02M 3/07 363/62 |
| 8,760,899 B1 * | 6/2014 | Sankaran | ............. | H02M 5/297 363/163 |
| 10,361,657 B2 * | 7/2019 | Chataigner | .......... | H03B 5/1253 |
| 2005/0007800 A1 * | 1/2005 | Sheng | ................ | H05B 41/382 363/163 |
| 2006/0039169 A1 * | 2/2006 | Chen | ................ | H02M 3/33523 363/17 |
| 2006/0120115 A1 * | 6/2006 | Chen | ................ | H02M 3/33576 363/17 |
| 2006/0165220 A1 * | 7/2006 | Takahashi | ................ | H05G 1/10 378/109 |
| 2007/0052399 A1 * | 3/2007 | Chen | ................ | H02M 3/33523 323/282 |
| 2007/0152606 A1 * | 7/2007 | Wey | ................... | H05B 33/0809 315/274 |
| 2008/0231383 A1 * | 9/2008 | Chang | ................ | H03D 7/1441 330/296 |
| 2009/0184754 A1 * | 7/2009 | Chen | ...................... | H03F 3/217 327/537 |
| 2009/0195082 A1 * | 8/2009 | Chen | ................ | H03K 17/6874 307/125 |
| 2010/0052360 A1 | 3/2010 | Chen | | |
| 2010/0109724 A1 * | 5/2010 | Huang | ................ | H03B 5/1215 327/156 |
| 2011/0110463 A1 * | 5/2011 | Chang | ................ | H03D 7/1458 375/316 |
| 2014/0029309 A1 * | 1/2014 | Jones | ...................... | H02M 1/14 363/15 |
| 2014/0070898 A1 * | 3/2014 | Shirinfar | ............. | H03B 5/1228 331/117 FE |
| 2014/0292419 A1 * | 10/2014 | Ragonese | ............... | H03B 1/02 331/46 |
| 2015/0180528 A1 * | 6/2015 | Ragonese | ............ | H03B 5/1212 375/219 |
| 2015/0229316 A1 * | 8/2015 | Walker | ................... | H03L 7/099 331/2 |
| 2016/0087914 A1 | 3/2016 | Goswami et al. | | |
| 2016/0373058 A1 * | 12/2016 | Murphy | ............... | H03B 5/1228 |
| 2017/0117879 A1 * | 4/2017 | Chakraborty | ............ | H03J 3/02 |
| 2017/0346443 A1 * | 11/2017 | Chataigner | .......... | H03B 5/1215 |
| 2017/0358993 A1 * | 12/2017 | Ragonese | ........ | H02M 3/33584 |
| 2018/0367097 A1 * | 12/2018 | Martineau | ............ | H03B 5/1228 |
| 2019/0043661 A1 * | 2/2019 | Jin | ........................ | H02M 3/337 |
| 2019/0081595 A1 * | 3/2019 | Luo | ........................ | H03B 5/1215 |
| 2019/0181764 A1 * | 6/2019 | Pentakota | ............... | H01L 25/18 |
| 2019/0181817 A1 * | 6/2019 | Al-Shyoukh | ......... | H02M 7/797 |
| 2019/0305608 A1 * | 10/2019 | Pentakota | ............. | H01L 23/495 |
| 2020/0212843 A1 * | 7/2020 | Hsueh | ................... | H03B 5/1228 |
| 2021/0135676 A1 * | 5/2021 | Hirai | ........................ | H03B 5/124 |
| 2021/0305940 A1 * | 9/2021 | Li | ........................ | H03B 5/1253 |
| 2022/0021337 A1 * | 1/2022 | Chan | .................... | H03B 5/1212 |

\* cited by examiner

US 11,482,924 B2

POWER ISOLATOR EXHIBITING LOW ELECTROMAGNETIC INTERFERENCE

FIELD OF THE DISCLOSURE

The present disclosure relates to power isolator configurations which exhibit low electromagnetic interference.

BACKGROUND

Power isolators may be, for example, electronic devices that are configured to receive input power and provide output power that is isolated from the input power. Thus, the power isolator may prevent certain disturbances in the power received at the input from being propagated to the output. Power isolators may include a single transformer that provides the isolation. The primary side of the transformer may be driven by an alternating current (AC) signal generated by a driver circuit that is converted into a direct current (DC) signal on the secondary side of the transformer using an AC/DC converter.

SUMMARY OF THE DISCLOSURE

Power isolators for providing electrical isolation between an input port and an output port that exhibit low electromagnetic interference (EMI) are described. The low EMI may be achieved by, for example, canceling out a common mode current across a transformer in the power isolator that may be converted into EMI. The power isolator may include at least one oscillator circuit that is configured to apply a first signal to a first transformer and a second, different signal to a second transformer. The first and second signals may be configured such that the common mode current generated in each of the first and second transformers has an opposite direction. Thus, the common mode currents in the first and second transformers may at least partially cancel out. As a result, the EMI exhibited by the power isolator may be reduced.

In some embodiments, a power isolator is provided. The power isolator comprises a first transformer including a primary coil and a secondary coil, a second transformer including a primary coil and a secondary coil, a first oscillator circuit coupled to the first transformer and configured to apply a first signal to the primary coil of the first transformer, a second oscillator circuit coupled to the second transformer and configured to apply a second signal to the primary coil of the second transformer, and a rectifier circuit coupled to the secondary coil of each of the first and second transformers and configured to generate a direct current (DC) voltage based on the output of the first and second transformers.

In some embodiments, a method of operating a power isolator is provided. The method comprises receiving an input direct current (DC) voltage, generating a first signal using the input DC voltage, generating a second signal using the input DC voltage that is different from the first signal, applying the first signal to a primary coil of a first transformer, applying the second signal to a primary coil of a second transformer, and generating a DC output voltage based on the output of a secondary coil of each of the first and second transformers.

Is some embodiments, a power isolator is provided. The power isolator comprises a first transformer including a primary coil and a secondary coil, a second transformer including a primary coil and a secondary coil, at least one oscillator circuit configured to apply a first signal to the primary coil of the first transformer and apply a second signal to the primary coil of the second transformer that is different from the first signal, a rectifier circuit coupled to the secondary coil of each of the first and second transformers and configured to generate a direct current (DC) voltage based on the output of the first and second transformers, and a means for keeping the first signal in-phase with the second signal.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

According to some aspects, power isolators which exhibit reduced electromagnetic interference (EMI) compared to conventional power isolators are provided. A conventional power isolator generally includes a driver circuit that generates an alternating current (AC) signal that is applied to the primary coil of a transformer, which is rectified on the secondary side of the transformer to generate direct current (DC) output power. The inventor has appreciated that such a conventional approach allows a substantial amount of common mode current to pass through the transformer from the driver circuit to the rectifier. The energy in the common mode current may be converted into, for example, undesirable electromagnetic radiation (referred to herein as EMI) that negatively impacts the operation of devices proximate the power isolator. Further, the inventor has appreciated that the common mode current through the transformer may be canceled out by another common mode current having an opposite direction. Thus, the energy that would have been converted into EMI is eliminated or otherwise reduced. Accordingly, aspects of the present disclosure provide power isolators that cancel out a common mode current from a primary side to a secondary side of a first transformer using another common mode current from a secondary side to a primary side of a second transformer.

In some embodiments, the power isolator includes two oscillator circuits that are each configured to generate a signal to be applied to a primary coil of a transformer. The signal generated by each of the oscillator circuits may be different such that the common mode current generated in each transformer has an opposite direction. For example, the first oscillator circuit may be configured to generate a first signal that induces a common mode current from a primary side to a secondary side of a first transformer and the second oscillator circuit may be configured to generate a second signal that induces a common mode current from a secondary side to a primary side of a second transformer. Thus, these common mode currents may cancel each other out and, as a result, reduce the EMI generated by the power isolator. For example, the EMI may be five times smaller than the EMI from a conventional power isolator that employs a single transformer. The output of each transformer may be combined using, for example, a rectifier circuit that generates a DC output voltage based on the output of the secondary coils of the first and second transformers.

The aspects and embodiments described above, as well as additional aspects and embodiments, are described further below. These aspects and/or embodiments may be used individually, all together, or in any combination of two or more, as the application is not limited in this respect.

Figure 1:
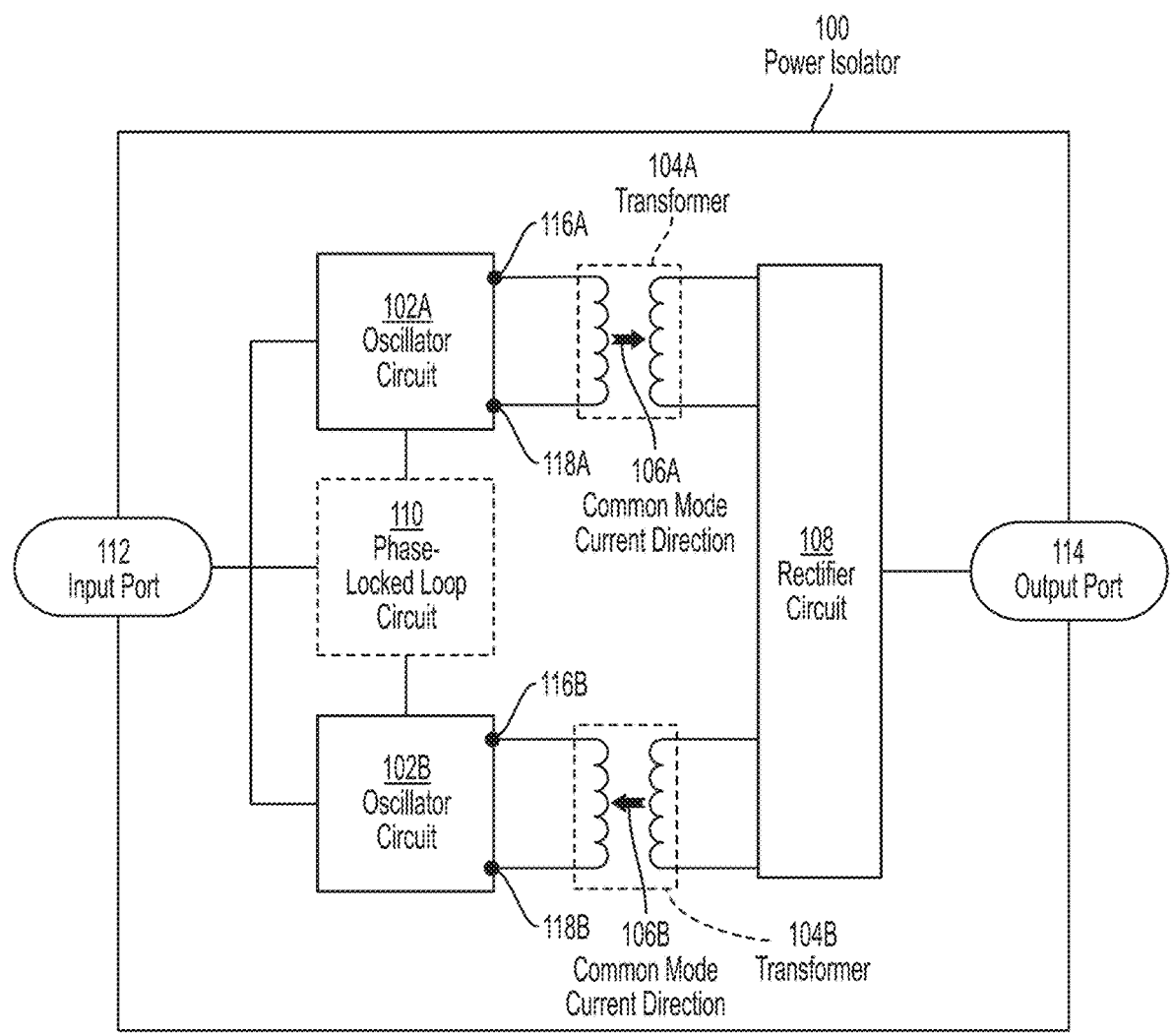
FIG. 1 is a diagram showing an example power isolator, according to some embodiments.

FIG. 1 shows an example power isolator 100, according to some embodiments. The power isolator 100 may provide power isolation between an input port 112 and an output port 114. The input port 112 may be in a different voltage domain than the output port 114. For example, the voltage domain at the input port 112 of the isolator may be a low voltage domain and the voltage at the output port 114 may be in a high voltage domain. Alternatively, the input port 112 may be in the same voltage domain than the output port 114. For example, the voltage domain at both the input port 112 and the output port 114 may be either a low voltage domain or a high voltage domain. As shown in FIG. 1, the power isolator 100 comprises oscillator circuits 102A and 102B that each use power (e.g., DC power) from the input port 102 to generate signals that are applied to the primary coils of the transformers 104A and 104B, respectively. A phase-locked loop circuit 110 may be coupled to oscillator circuits 102A and 102B to keep the phase of the signal generated by the oscillator circuit 102A in-sync with the phase of the signal generated by the oscillator circuit 102B. The signal generated by the oscillator circuit 102A may, when applied to the transformer 104A, induce a common mode current in the transformer 104A from the primary side of the transformer 104A to the secondary side of the transformer 104A as shown by common mode current direction 106A. Conversely, the signal generated by the oscillator circuit 102B may, when applied to the transformer 104B, induce a common mode current in the transformer 104B from the secondary side of the transformer 104B to the primary side of the transformer 104B as shown by common mode current direction 106B. Thus, the common mode current through transformer 104A may at least partially cancel out the common mode current in transformer 104B and, as a result, reduce the EMI generated by the power isolator 100. The output of the secondary coils in the transformers 104A and 104B may be provided to a rectifier circuit 108 that generates output power (e.g., DC output power) that is supplied to the output port 114 based on the output of the transformers 104A and 104B.

The oscillator circuits 102A and 102B may each be configured to generate a signal that is output to a primary coil of the transformers 104A and 104B, respectively. In particular, the oscillator circuit 102A may apply a signal to the primary coil of the transformer 104A via terminals 116A and 118A and the oscillator circuit 102B may apply a signal to the primary coil of the transformer 104B via terminals 116B and 118B. The signals generated by the oscillator circuits 102A and 102B may be, for example, oscillatory signals that vary within a voltage range and periodically repeat. Example oscillatory signals include sine waves (or an approximation thereof) and half-sine waves (or an approximation thereof). The signal generated by the oscillator circuit 102A may be different from signal generated by the oscillator circuit 102B. For example, the signal generated by the oscillator circuits 102A and 102B may have different shapes and/or vary between different ranges. Further, the signals generated by the oscillator circuit 102A and 102B may be configured to induce common mode currents in the transformers 104A and 104B, respectively, in different directions. For example, the signal generated by the oscillator circuit 102A may be configured to induce a common mode current from the primary side to the secondary side of the transformer 104A (shown by common mode current direction 106A) and the signal generated by the oscillator circuit 102B may be configured to induce a common mode current from the secondary side to the primary side of the transformer 104B (shown by common mode current direction 106B).

The oscillator circuits 102A and 102B may be implemented in any of a variety of ways. For example, the oscillator circuits 102A and/or 102B may be implemented as an inductor-capacitor (LC) tank circuit that employs the primary coil of the transformers 104A and/or 104B, respectively, as the inductance and includes one or more capacitances that resonate with the inductance of the primary coil. The oscillator circuit 102A may be constructed differently from the oscillator circuit 102B. For example, the oscillator circuit 102A may be implemented as an n-type metal-oxide-semiconductor (NMOS) oscillator using one or more NMOS devices, such as NMOS transistors, and the oscillator 102B may be implemented as a p-type metal-oxide-semiconductor (PMOS) using one or more PMOS devices, such as PMOS transistors.

Thus, it should be appreciated that in some embodiments the power isolator 100 comprises a plurality of transformers including a first transformer coupled to a PMOS oscillator and a second transformer coupled to an NMOS oscillator. In some embodiments, the signals generated by each of the PMOS and NMOS oscillators may be different. For example, the signal generated by the PMOS oscillator may be an inverted version (e.g., have an opposite polarity) relative to the signal generated by the NMOS oscillator. Thus, the signal generated by the PMOS oscillator may induce a common mode current in a transformer in a different direction than the signal generated by the NMOS oscillator.

The transformers 104A and 104B may be, for example, configured to transfer energy via electromagnetic induction. The transformers 104A and 104B may be separate and distinct devices having both separate and distinct primary coils and separate and distinct secondary coils. The transformers 104A and 104B may have any of a variety of constructions. For example, the transformers 104A and/or 104B may be constructed as planar transformers where each of the primary and secondary coils of the transformer are disposed within a 2-dimensional plane.

The phase-locked loop circuit 110 may be configured to keep the signals output by each of the oscillator circuits 102A and 102B in-phase. For example, the phase-locked loop circuit 110 may be configured to monitor a phase difference between the signals output by the oscillator circuits 102A and 102B and adjust (e.g., advance or delay) the phase of one or more of the signals to maintain a zero phase difference. The phase-locked loop circuit 110 may be constructed in any of a variety of ways. For example, the phase-locked loop circuit 110 may comprise a plurality of transistors, such as NMOS and/or PMOS transistors, that selectively couple one or more of the terminals 116A, 116B, 118A, and/or 118B to a supply voltage or a reference potential to adjust a phase of the signals output by the oscillator circuits 102A and/or 102B.

It should be appreciated that the signals generated by the oscillators 102A and 102B may be kept in-phase without employing the phase-locked loop circuit 110. In some embodiments, the transformers 104A and 104B may be specially constructed so as to perform the same function as the phase-locked loop circuit 110. For example, the transformers 104A and 104B may be implemented as a pair of co-axial transformers where at least part of the primary and/or secondary coils of both transformers are disposed around (e.g., wound around) a common axis. Such a configuration may provide a mutual inductance between the transformers 104A and 104B that keeps the first signal in-sync with the second signal. Thus, the phase-locked loop circuit 110 may be omitted altogether.

The rectifier circuit 108 may be configured to generate the output voltage to be provided at the output port 114 based on the output of the secondary coils of the transformers 104A and 104B. For example, the rectifier circuit 108 may be configured to combine the power output by each of transformers 104A and 104B and/or convert the output from the transformers 104A and/or 104B to a direct current (DC) voltage. The rectifier circuit 108 may be implemented in any of a variety of ways. For example, the rectifier circuit 108 may comprise a full-wave rectifier (e.g., a full-wave bridge rectifier), a half-wave rectifier, and/or a capacitance.

It should be appreciated that the power isolator 100 may be implemented using one or more semiconductor dies. For example, the components of the power isolator 100 may be implemented in a single semiconductor die that may be integrated into a circuit package. In another example, the components of the power isolator 100 may be distributed into a plurality of semiconductor dies that may be electrically connected. The plurality of dies may be integrated into a single circuit package or multiple circuit packages. Additionally, other circuits configured to perform additional operations may be integrated into the power isolator 100 without departing from the scope of the present disclosure. For example, the power isolator 100 may include additional components to further reduce the EMI, such as a stitching capacitor or a common mode choke, and/or a data isolator circuit to enable the power isolator 100 to provide both power and data isolation.

Figure 2:
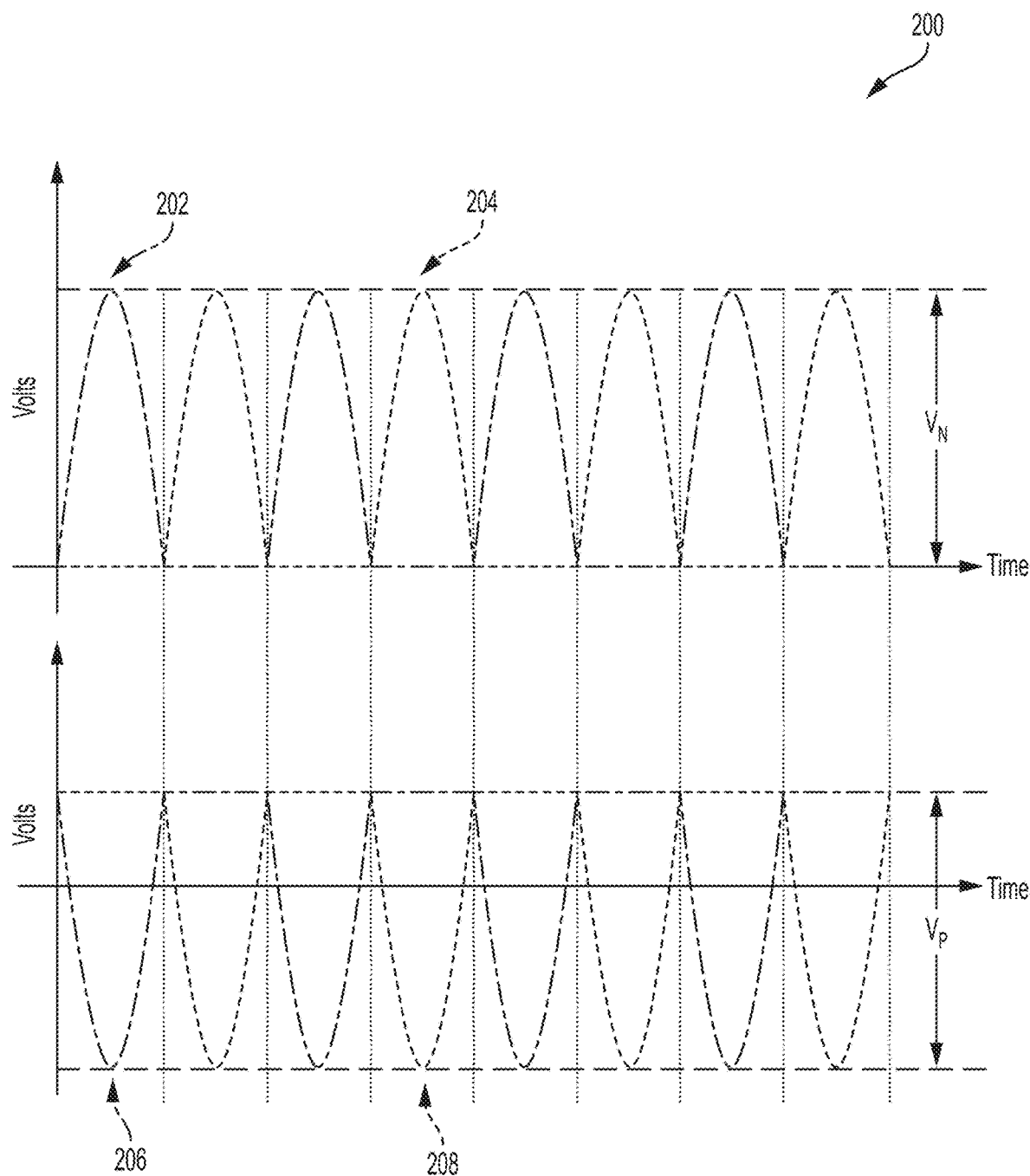
FIG. 2 is a graph of example signals generated by oscillator circuits, according to some embodiments.

As discussed above, the signals generated by the oscillator circuits 102A and 102B may be configured such that the common mode current in the transformer 104A at least partially cancels out the common mode current in the transformer 104B. An example of such a set of signals is shown in FIG. 2 by graph 200. In the graph 200, waveform 202 is the voltage at terminal 116A of the oscillator circuit 102A relative to a reference potential that varies within a voltage range $V_N$, waveform 204 is the voltage at terminal 118A of the oscillator circuit 102A relative to the reference potential that varies within the voltage range $V_N$, waveform 206 is the voltage at terminal 116B of the oscillator circuit 102B relative to a reference potential that varies within a voltage range $V_P$, and waveform 208 is the voltage at terminal 118B of the oscillator circuit 102B relative to a reference potential that varies within the voltage range $V_P$.

As shown by graph 200, the signals output by the oscillators 102A and 102B have the same period, the same frequency, and the same peak-to-peak voltage. However, the signal output by the oscillator 102B is not identical to the signal output by the oscillator 102A. In particular, the signal output by the oscillator 102A is an inverted version of the signal output by the oscillator 102B and varies within a different voltage range (e.g., an offset voltage range). For example, the voltage ranges of the signals output by the oscillators 102A and 102B may only partially overlap or not overlap at all. The differences in the signals output by the oscillators 102A and 102B may induce common mode currents in different directions in the transformers 104A and 104B. For example, the oscillator 102A may induce a common mode current from the primary side to the secondary side of the transformer 104A as the waveforms 202 and/or 204 increase. Conversely, the oscillator 102B may induce a common mode current from the secondary side to the primary side of the transformer 104B as the waveforms 206 and/or 208 decrease. Thus, the common mode currents may at least partially cancel each other out to reduce the EMI. It should be appreciated that the particular waveforms shown in FIG. 2 are only example waveforms and other waveforms may be employed.

Figure 3A:
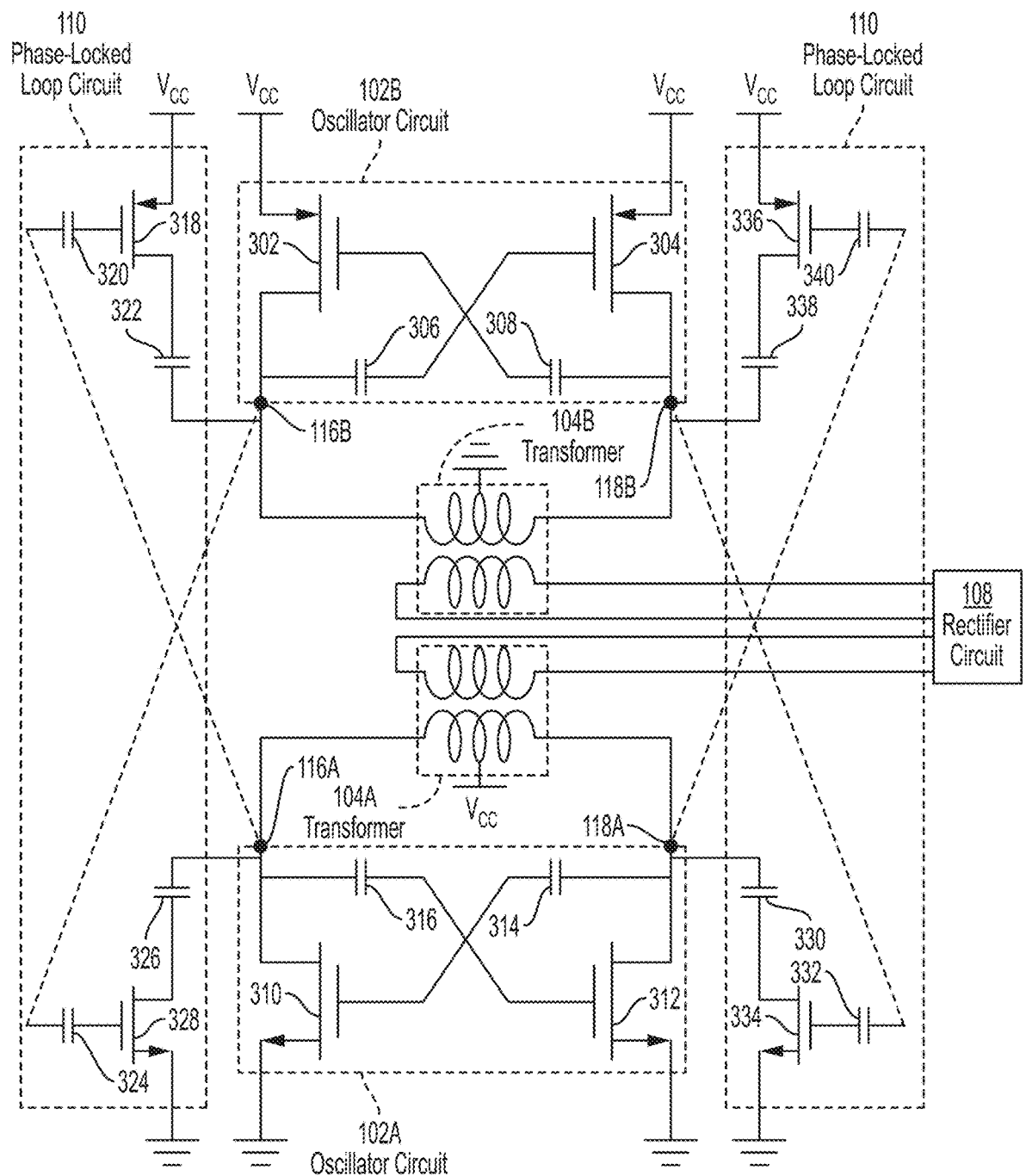
FIG. 3A is a circuit diagram showing a non-limiting example implementation of the power isolator shown in FIG. 1, according to some embodiments.

FIG. 3A shows an example circuit diagram depicting an example implementation of the power isolator 100 described above that includes the phase-locked loop circuit 110. As shown, the oscillator 102B is implemented using PMOS transistors 302 and 304 each coupled between a supply voltage ($V_{cc}$) (e.g., received via input port 112) and one terminal of a primary coil of the transformer 104B. The oscillator 102B further comprises capacitances 306 and 308 each coupled between a gate terminal of one of the transistors 302 and 304 and one terminal of the primary coil of the transformer 104B. The transformer 104B may be, for example, a center-tap transformer as shown in FIG. 3A with a tap on the primary coil that is coupled to a reference potential (e.g., received via input port 112), such as ground. The oscillator 102A is implemented using NMOS transistors 310 and 312 each coupled between a reference potential and one terminal of a primary coil of the transformer 104A. The oscillator 102A further comprises capacitances 306 and 308 each coupled between a gate terminal of one of the transistors 302 and 304 and one terminal of the primary coil of the transformer 104A. The transformer 104A may be, for example, a center-tap transformer as shown in FIG. 3A with a tap on the primary coil that is coupled to a supply voltage.

The phase-locked loop circuit 110 is implemented using a plurality of NMOS transistors 328 and 334 and PMOS transistors 318 and 336. The phase-locked loop circuit 110 may be configured such that the voltage at terminal 116A is kept in-phase with the voltage at terminal 116B and, similarly, the voltage at terminal 118A is kept in-phase with the voltage at terminal 118B. As shown in FIG. 3A, the PMOS transistors 318 and 336 each are coupled between a supply voltage and (via capacitances 322 and 338, respectively) one terminal of the primary coil of the transformer 104B. The gate terminals of PMOS transistors 318 and 336 are each coupled (via capacitances 320 and 340, respectively) to one terminal of the primary coil of the transformer 104A. The NMOS transistors 328 and 334 each are coupled between a reference potential and (via capacitances 326 and 330, respectively) one terminal of the primary coil of the transformer 104A. The gate terminals of NMOS transistors 328 and 334 are each coupled (via capacitances 324 and 332, respectively) to one terminal of the primary coil of the transformer 104B.

Figure 3B:
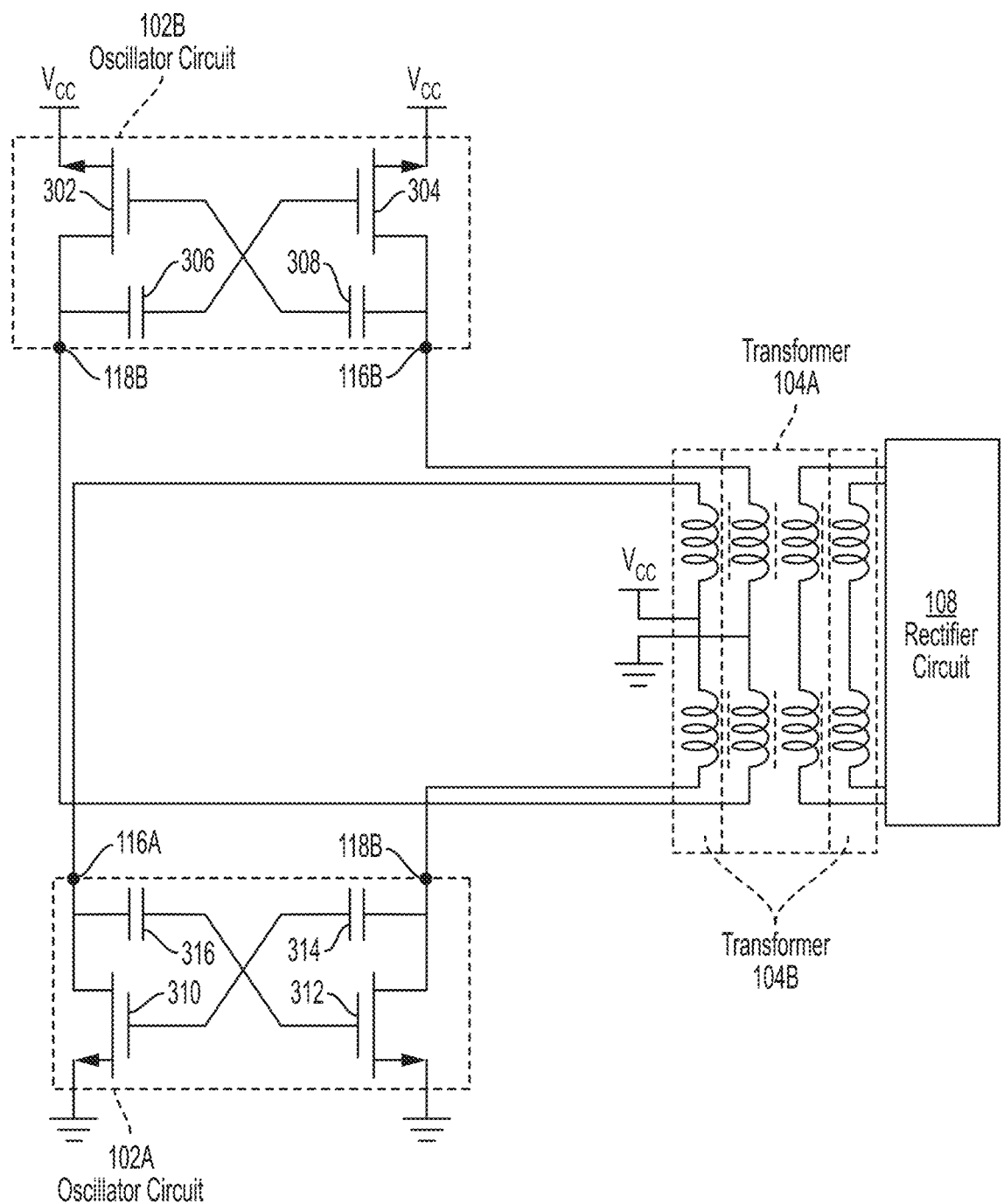
FIG. 3B is a circuit diagram showing another non-limiting example implementation of the power isolator shown in FIG. 1, according to some embodiments.

FIG. 3B shows an example circuit diagram depicting an example implementation of the power isolator 100 described above without phase-locked loop circuit 110. Relative to FIG. 3A, the phase-locked look circuit 110 is removed and the transformers 104A and 104B are arranged so as to have mutual inductance (shown by the dashed lines between the coils). The mutual inductance between the coils of the transformers 104A and 104B may keep the signal generated by the oscillator circuit 102B in-phase with the signal generated by the oscillator circuit 102A. In particular, the mutual inductance may keep the voltage at terminal 116A in-phase with the voltage at terminal 116B and, similarly, the voltage at terminal 118A in-phase with the voltage at terminal 118B. The mutual inductance may be achieved by, for example, implementing the transformers 104A and 104B as a pair of co-axial transformers.

Figure 4:
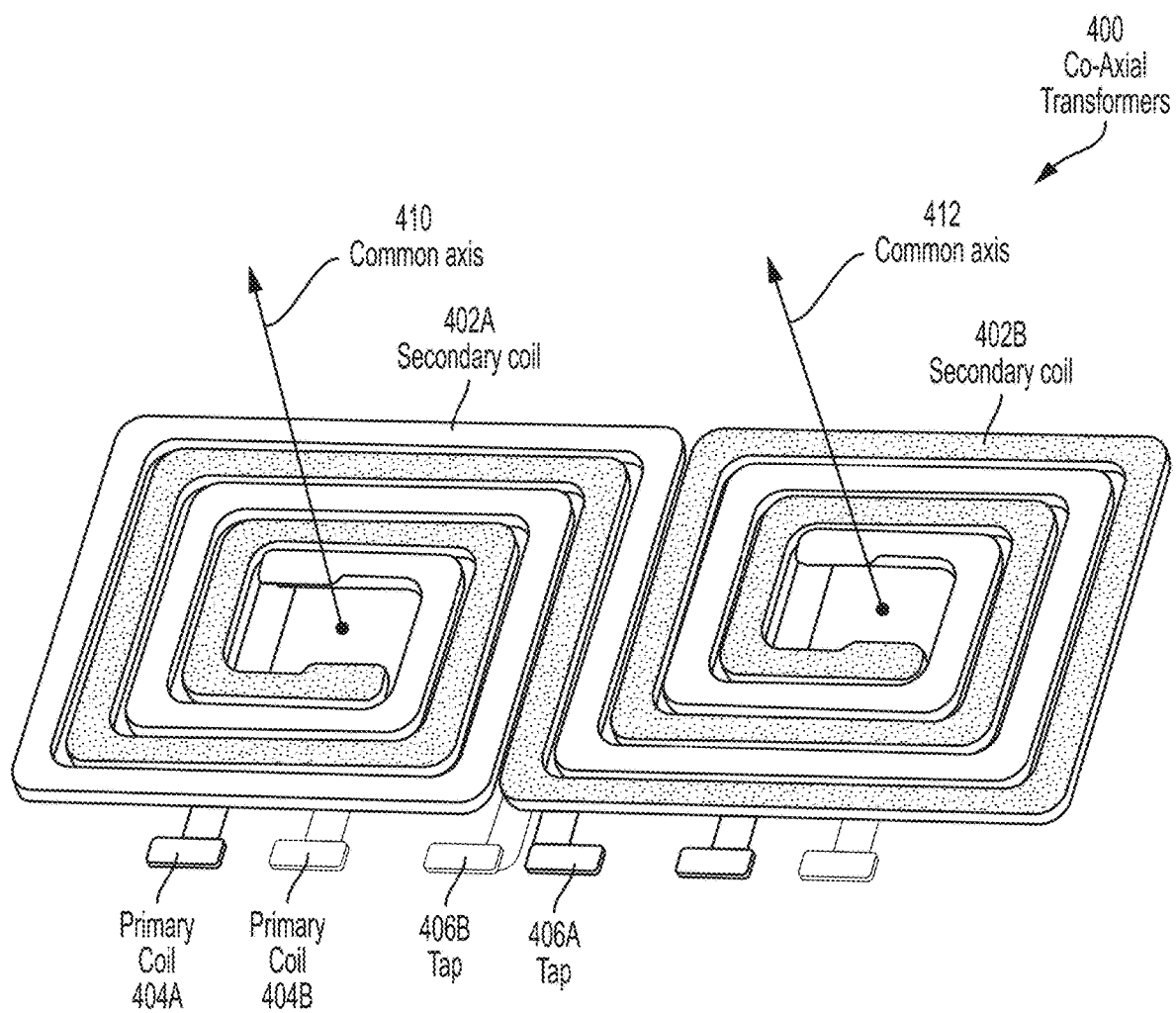
FIG. 4 is a diagram of an example implementation of co-axial transformers, according to some embodiments.

An example pair of co-axial transformers is shown in FIG. 4 by example co-axial transformers 400. As shown, the co-axial transformers 400 comprise primary coils 404A and 404B that are disposed directly under secondary coils 402A and 402B. Each of the primary coils 404A and 404B may have a center tap shown by taps 406A and 406B, respectively. Each of the primary and secondary coils 404A, 404B, 402A, 402B may be planar coils disposed around (e.g., wound around) at least one common axis (shown as common axes 410 and 412) that is perpendicular to the planes in which the coils are disposed. The particular way in which the coils are disposed around the at least one common axis may vary based on the particular implementation. The coils may be made in any of a variety of shapes such as, a circular spiral shape, a rectangular spiral shape, etc. For example, the coils may be wound in an "S-shape" as shown in FIG. 4 where the outer-most coil around axis 410 is different from the outer-most coil around axis 412. In another example, the coils may be wound in a "C-shape" where the outer-most coil around axis 410 is the same as the outer-most coil around axis 412.

It should be appreciated that various alterations may be made to the implementations of the power isolator shown in FIG. 3A and/or FIG. 3B without departing from the scope of the present disclosure. For example, the oscillator circuit 102A may add one or more additional PMOS transistor in series with each of PMOS transistors 302 and/or 304. Further, additional components may be added to the power isolator to implement a kick-start circuit to facilitate startup of the oscillators 102A and/or 102B.

Figure 5:
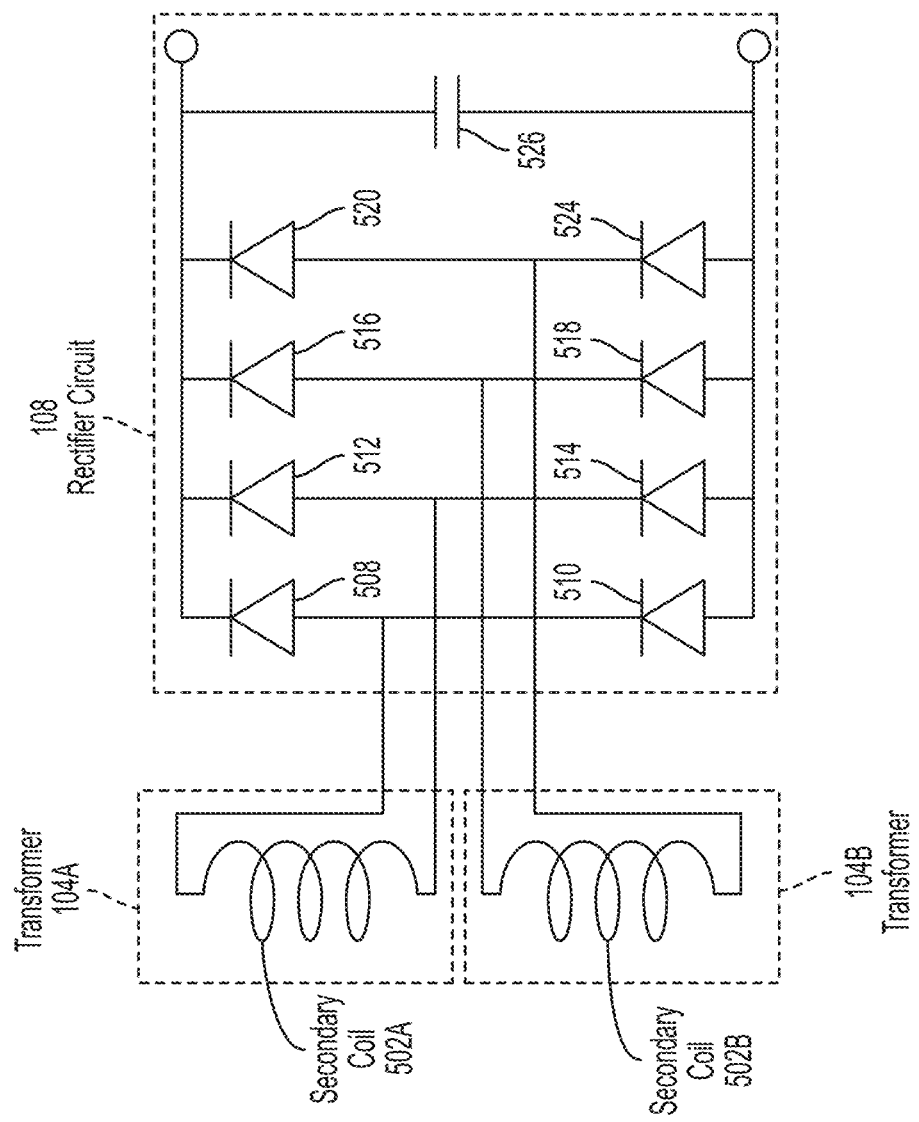
FIG. 5 is a circuit diagram showing a non-limiting example implementation of the rectifier circuit of the power isolator shown in FIG. 1, according to some embodiments.

FIG. 5 shows a diagram of an example implementation of the rectifier circuit 108 in power isolator 100. As shown, the transformers 105A and 105B may each receive an oscillatory signal that, in turn, induces another oscillatory signal on the secondary coils 502A and 502B, respectively. The oscillatory signal on the secondary coils 502A and 502B may be combined and converted into a DC voltage by the rectifier circuit 108. As shown, the rectifier circuit 108 may employ two full-wave bridge rectifiers (one for each of the secondary coils 502A and 502B) that are coupled together to combine and rectify the oscillatory signals from the secondary coils 502A and 502B. The first full-wave bridge rectifier may be formed by diodes 508, 510, 512, and 514 and the second full-wave bridge rectifier may be formed by diodes 516, 518, 520, 524. The output of the full-wave bridge rectifiers may be smoothed by a capacitance 526 coupled in parallel with the full-wave bridge rectifiers.

It should be appreciated that various alterations may be made to the implementation of the rectifier circuit 108 shown in FIG. 5 without departing from the scope of the present disclosure. For example, the rectifier circuit 108 may use other types of rectifiers separate and apart from full-wave bridge rectifiers such as other types of full-wave rectifiers and/or half-wave rectifiers. Additionally (or alternatively), the rectifier circuit 108 may comprise one or more voltage regulator circuits to regulate the output DC voltage.

Figure 6:
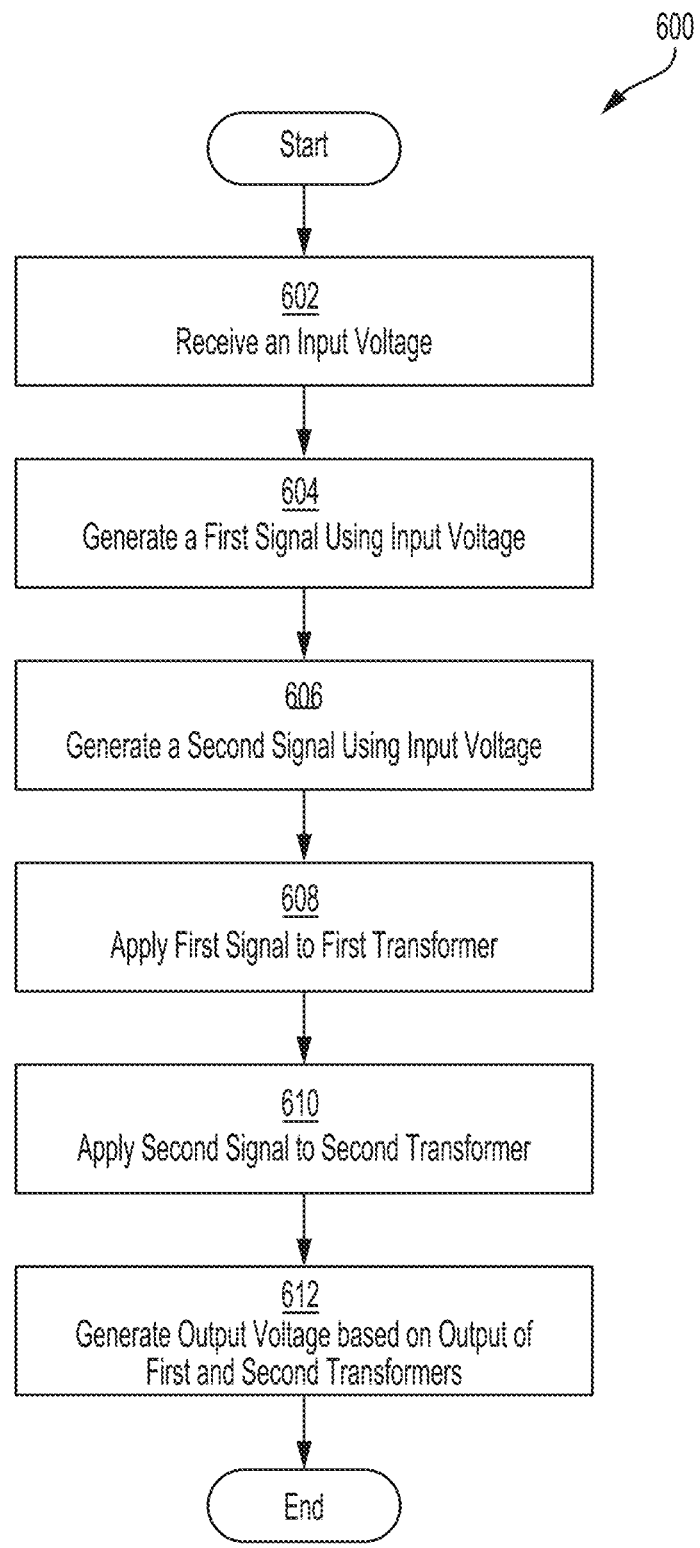
FIG. 6 is a flowchart showing an example method of operation of a power isolator, according to some embodiments.

As discussed above, a power isolator is disclosed herein that may be configured to provide power isolation between an input port and an output port with minimal EMI. These power isolators may perform various processes to, for example, provide the power isolation. An example of such a process to operation the power isolator to provide isolation is shown in FIG. 6 by process 600. The process 600 includes an act 602 of receiving an input voltage, an act 604 of generating a first signal using the input voltage, an act 606 of generating a second signal using the input voltage, an act 608 of applying the first signal to a first transformer, an act 610 of applying the second signal to a second transformer, and an act 612 of generating an output voltage based on the output of the first and second transformers.

In act 602, the power isolator may receive an input voltage. The input voltage may be, for example, a DC voltage from another device, such as a power supply.

In act 604, the power isolator may generate a first signal using the input voltage. For example, the power isolator may use the input voltage to power a first oscillator circuit (e.g., oscillator circuit 110A) that generates the first signal. The first signal may be, for example, a first oscillatory signal that varies within a voltage range and repeats periodically.

In act 606, the power isolator may generate a second signal using the input voltage. For example, the power isolator may use the input voltage to power a second oscillator circuit (e.g., oscillator circuit 110B) that generates the second signal. The second signal may be, for example, a second oscillatory signal that varies within a voltage range and repeats periodically. The second oscillator signal may have the same period, frequency, and/or peak-to-peak voltage as the first oscillatory signal. The second oscillatory signal, however, may be different from the first signal. For example, the second oscillatory signal may be an inverted version of the first oscillatory signal that varies within a different voltage range than the first oscillatory signal.

In act 608, the power isolator may apply the first signal to a first transformer. For example, the power isolator may apply the first signal to a primary coil of the first transformer. Applying the first signal to the first transformer may, for example, induce a common mode current in the first transformer.

In act 610, the power isolator may apply the second signal to a second transformer that is separate and distinct from the first transformer. For example, the power isolator may apply the second signal to a primary coil of the second transformer. Applying the second signal to the second transformer may, for example, induce a common mode current in the second transformer. The direction of the common mode current induced in the second transformer may be opposite that of the common mode current induced in the first transformer. Thus, the common mode current in the second transformer may at least partially cancel the common mode current in the first transformer.

In act 612, the power isolator may generate an output voltage based on the output of the first and second transformers. The output voltage may be, for example, a DC voltage. The power isolator may, for example, combine the output from the secondary coils of the first and second transformers and output the combined power.

Figure 7:
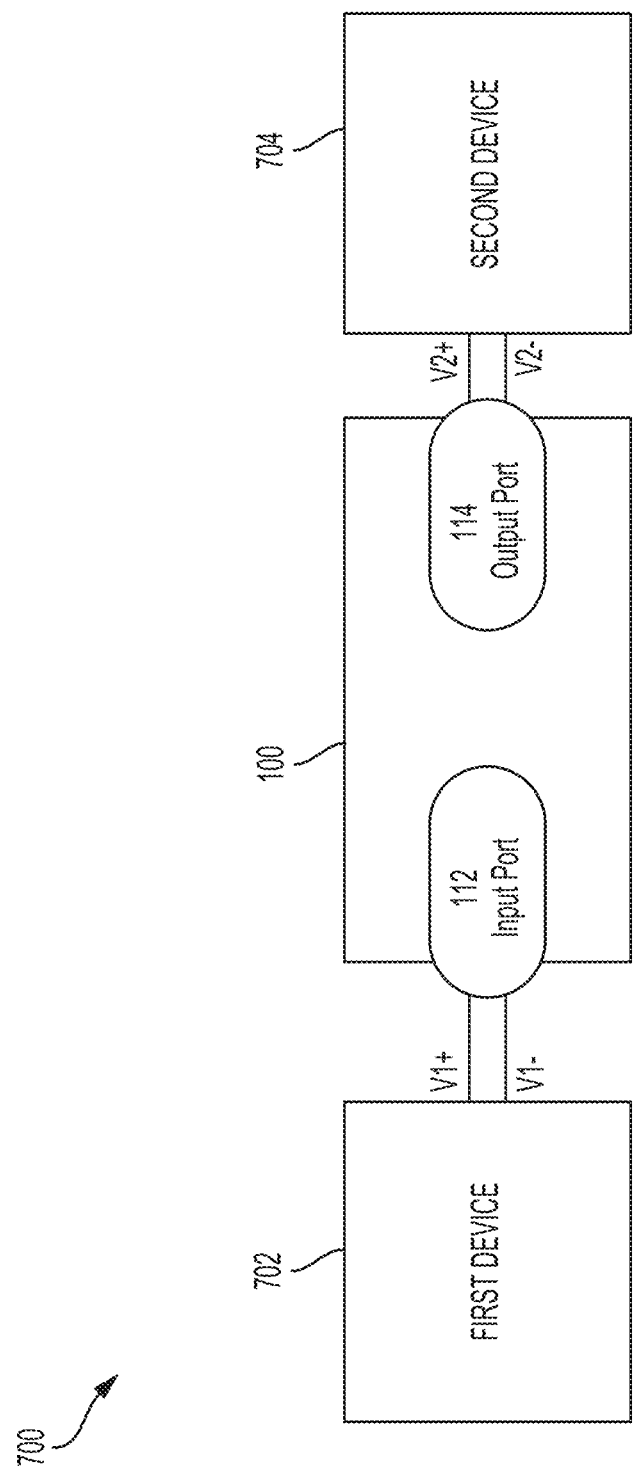
FIG. 7 is a block diagram illustrating a system comprising the power isolator of FIG. 1, according to some non-limiting embodiments.

FIG. 7 is a block diagram illustrating an example of a system 700 comprising the power isolator 100 described above. As shown, the system 700 includes a first device 702 coupled the input port 112 of the power isolator 100 and a second device 706 coupled to the output port 114 of the power isolator 100. The power isolator 100 may provide, for example, power isolation between the first device 702 and the second device 704. The first device 702 and the second device 704 may be in the same voltage domain or different voltage domains.

The first device 702 may be configured to provide power (e.g., DC power) to the input port 112, such as a power supply (e.g., a DC power supply). The first device 702 may be configured to output power at a first voltage level. The voltage output by the first device 702 (and received by the input port 112) is shown as a positive supply voltage V1+ and negative supply voltage V1− (e.g., a reference potential) and the first voltage level may be the potential difference between V1+ and V1−.

The second device 704 may be configured to consume power (e.g., DC power) output at the output power port 114. The second device 704 may be configured to consume power at a second voltage level. The voltage received by the second device 704 (and output by the output port 114) is shown as a positive supply voltage V2+ and a negative supply voltage V2− (e.g., a reference potential) and the second voltage level may be the potential difference between V2+ and V2−.

In some embodiments, the first device 702 may be in a different voltage domain than the second device 704. In these embodiments, the second voltage level may be different from the first voltage level (e.g., smaller or larger than the first voltage level). For example, the potential difference between V2+ and V2− may not be the same as the difference between V1+ and V1−. Additionally (or alternatively), the first voltage level may be offset relative to the second voltage level. For example, the potential at V1− may not match the potential at V2− (irrespective of whether the potential difference between V1+ and V1− matches the potential difference between V2+ and V2−). The power isolator 100 may be configured to support a substantial offset between the first and second voltage levels including, for example, a potential difference between V1− and V2− of at least 250 Volts, 500 Volts, 750 Volts, and/or 1000 Volts.

In some embodiments, the first device 702 may be in the same voltage domain as the second device 704. In these embodiments, the first voltage level may be the same as the second voltage level. For example, the potential difference between V2+ and V2− may be the same as the difference between V1+ and V1−. Additionally, there may be no offset between the first and second voltage levels. For example, the potential at V1− may match the potential at V2−.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A power isolator, comprising:
   a first transformer including a first coil and a second coil;
   a second transformer including a third coil and a fourth coil;
   a first oscillator circuit coupled to first and second terminals of the first coil of the first transformer and configured to apply a first signal to the first and second terminals of the first coil of the first transformer to induce a first common mode current in the first transformer, wherein a third terminal of the first coil is configured to receive a first input power supply voltage;
   a second oscillator circuit coupled to fourth and fifth terminals of the third coil of the second transformer and configured to apply a second signal to the fourth and fifth terminals of the third coil of the second transformer to induce a second common mode current in the second transformer that at least partially cancels out the first common mode current, wherein a sixth_terminal of the third coil is configured to receive a second input power supply voltage that is different from the first input power supply voltage; and
   a rectifier circuit coupled to the second coil and the fourth coil of the first and second_transformers, respectively, and configured to generate a direct current (DC) voltage based on an output of the first and second transformers,
   wherein the second signal is an inverted version of the first signal,
   wherein the first oscillator circuit comprises at least one p-type metal-oxide-semiconductor (PMOS) device comprising:
      a first PMOS transistor coupled between the second input power supply voltage and the first terminal of the first coil of the first transformer; and
      a second PMOS transistor coupled between the second input power supply voltage and the second terminal of the first coil of the first transformer, and
   wherein the second oscillator circuit comprises at least one n-type metal-oxide-semiconductor (NMOS) device comprising:
      a first NMOS transistor coupled between the first input power supply voltage and the fourth terminal of the third coil of the second transformer; and
      a second NMOS transistor coupled between the first input power supply voltage and the fifth terminal of the third coil of the second transformer.

2. The power isolator of claim 1, wherein the first signal is a first oscillatory signal that periodically repeats and varies within a first voltage range and wherein the second signal is a second oscillatory signal that periodically repeats and varies within a second voltage range that is different from the first voltage range.

3. The power isolator of claim 2, wherein the first oscillatory signal has a same period and a same frequency as the second oscillatory signal.

4. The power isolator of claim 1, further comprising a phase-locked loop circuit coupled to the first and second oscillator circuits and configured to keep a first voltage at the first terminal of the first coil in-phase with a second voltage at the fourth terminal of the third coil and a third voltage at the second terminal of the first coil in-phase with a fourth voltage at the fifth terminal of the third coil.

5. The power isolator of claim 1, wherein the first and second transformers are planar transformers.

6. The power isolator of claim 5, wherein the first and second transformers are a pair of co-axial transformers having at least some mutual inductance that is configured to keep a first voltage at the first terminal of the first coil in-phase with a second voltage at the fourth terminal of the third coil and a third voltage at the second terminal of the first coil in-phase with a fourth voltage at the fifth terminal of the third coil.

7. The power isolator of claim 1, wherein:
the first input power supply voltage is a ground voltage, and the second input power supply voltage is a high input power supply voltage.

8. A power isolator, comprising:
a first transformer including a first coil and a second coil;
a second transformer including a third coil and a fourth coil;
a first oscillator circuit coupled to first and second terminals of the first coil of the first transformer and configured to apply a first signal to the first and second terminals of the first coil of the first transformer to induce a first common mode current in the first transformer, wherein a third terminal of the first coil is configured to receive a first input power supply voltage;
a second oscillator circuit coupled to fourth and fifth terminals of the third coil of the second transformer and configured to apply a second signal to the fourth and fifth terminals of the third coil of the second transformer to induce a second common mode current in the second transformer that at least partially cancels out the first common mode current, wherein a sixth_terminal of the third coil is configured to receive a second input power supply voltage that is different from the first input power supply voltage;
a rectifier circuit coupled to the second coil and the fourth coil of the first and second_transformers, respectively, and configured to generate a direct current (DC) voltage based on an output of the first and second transformers,
wherein the second signal is an inverted version of the first signal; and
a phase-locked loop circuit coupled to the first and second oscillator circuits and configured to keep a first voltage at the first terminal of the first coil in-phase with a second voltage at the fourth terminal of the third coil and a third voltage at the second terminal of the first coil in-phase with a fourth voltage at the fifth terminal of the third coil.

9. The power isolator of claim 8, wherein the first oscillator circuit comprises at least one p-type metal-oxide-semiconductor (PMOS) device and wherein the second oscillator circuit comprises at least one n-type metal-oxide-semiconductor (NMOS) device.

10. The power isolator of claim 9, wherein the first oscillator circuit comprises a first PMOS transistor coupled between the second input power supply voltage and the first terminal of the first coil of the first transformer and a second PMOS transistor coupled between the second input power supply voltage and the second terminal of the first coil of the first transformer.

11. The power isolator of claim 10, wherein the second oscillator circuit comprises a first NMOS transistor coupled between the first input power supply voltage and the fourth terminal of the third coil of the second transformer and a second NMOS transistor coupled between the first input power supply voltage and the fifth terminal of the third coil of the second transformer.

12. The power isolator of claim 8, wherein the phase-locked loop circuit comprises at least one p-type metal-oxide-semiconductor (PMOS) device and at least one n-type metal-oxide-semiconductor (NMOS) device.

13. The power isolator of claim 12, wherein the phase-locked loop circuit comprises an NMOS transistor coupled between the first input power supply voltage and the third coil of the second transformer that is controlled based on a voltage level at the first coil of the first transformer.

14. The power isolator of claim 13, wherein the phase-locked loop circuit comprises a PMOS transistor coupled between the second input power supply voltage and the first coil of the first transformer that is controlled based on a voltage level at the third coil of the second transformer.

15. The power isolator of claim 8, wherein:
the first input power supply voltage is a ground voltage, and the second input power supply voltage is a high input power supply voltage.

16. A power isolator, comprising:
a first transformer including a first coil and a second coil;
a second transformer including a third coil and a fourth coil;
a first oscillator circuit coupled to first and second terminals of the first coil of the first transformer and configured to apply a first signal to the first and second terminals of the first coil of the first transformer to induce a first common mode current in the first transformer, wherein a third terminal of the first coil is configured to receive a first input power supply voltage;
a second oscillator circuit coupled to fourth and fifth terminals of the third coil of the second transformer and configured to apply a second signal to the fourth and fifth terminals of the third coil of the second transformer to induce a second common mode current in the second transformer that at least partially cancels out the first common mode current, wherein a sixth_terminal of the third coil is configured to receive a second input power supply voltage that is different from the first input power supply voltage; and
a rectifier circuit coupled to the second coil and the fourth coil of the first and second_transformers, respectively, and configured to generate a direct current (DC) voltage based on an output of the first and second transformers,
wherein the second signal is an inverted version of the first signal, and
wherein the first and second transformers are a pair of planar transformers that are co-axial transformers having at least some mutual inductance that is configured to keep a first voltage at the first terminal of the first coil in-phase with a second voltage at the fourth terminal of the third coil and a third voltage at the second terminal of the first coil in-phase with a fourth voltage at the fifth terminal of the third coil.

17. The power isolator of claim 16, wherein the first oscillator circuit comprises at least one p-type metal-oxide-semiconductor (PMOS) device and wherein the second oscillator circuit comprises at least one n-type metal-oxide-semiconductor (NMOS) device.

18. The power isolator of claim 17, wherein the first oscillator circuit comprises a first PMOS transistor coupled between the second input power supply voltage and the first terminal of the first coil of the first transformer and a second PMOS transistor coupled between the second input power supply voltage and the second terminal of the first coil of the first transformer.

19. The power isolator of claim 18, wherein the second oscillator circuit comprises a first NMOS transistor coupled between the first input power supply voltage and the fourth terminal of the third coil of the second transformer and a second NMOS transistor coupled between the first input power supply voltage and the fifth terminal of the third coil of the second transformer.

20. The power isolator of claim 16, wherein:
the first input power supply voltage is a ground voltage, and the second input power supply voltage is a high input power supply voltage.

\* \* \* \* \*

UNITED STATES PATENT AND TRADEMARK OFFICE
CERTIFICATE OF CORRECTION

PATENT NO. : 11,482,924 B2
APPLICATION NO. : 16/046732
DATED : October 25, 2022
INVENTOR(S) : Wenhui Qin et al.

It is certified that error appears in the above-identified patent and that said Letters Patent is hereby corrected as shown below:

In the Claims

Claim 1, Column 10, Line 12, delete:
"wherein a sixth_terminal"
Should be replaced with:
--wherein a sixth terminal--

Claim 1, Column 10, Line 17, delete:
"first and second_transformers"
Should be replaced with:
--first and second transformers--

Claim 8, Column 11, Line 22, delete:
"wherein a sixth_terminal"
Should be replaced with:
--wherein a sixth terminal--

Claim 8, Column 11, Line 27, delete:
"first and second_transformers"
Should be replaced with:
--first and second transformers--

Claim 16, Column 12, Line 28, delete:
"wherein a sixth_terminal"
Should be replaced with:
--wherein a sixth terminal--

Signed and Sealed this
Twentieth Day of December, 2022

*Katherine Kelly Vidal*

Katherine Kelly Vidal
*Director of the United States Patent and Trademark Office*

Claim 16, Column 12, Line 33, delete:
"first and second_transformers"
Should be replaced with:
--first and second transformers--